United States Patent [19]
Tran et al.

[11] Patent Number: 6,133,142
[45] Date of Patent: *Oct. 17, 2000

[54] LOWER METAL FEATURE PROFILE WITH OVERHANGING ARC LAYER TO IMPROVE ROBUSTNESS OF BORDERLESS VIAS

[75] Inventors: Khanh Tran, San Jose; Jeff Shields, Sunnyvale, both of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/992,628

[22] Filed: Dec. 18, 1997

[51] Int. Cl.$^7$ ................................................. H01L 21/4763
[52] U.S. Cl. ........................... 438/625; 438/636; 438/637; 438/648; 438/666
[58] Field of Search .................... 438/637, 669, 438/622, 625, 634, 636, 652, 666, 688, 639, 648

[56] References Cited

U.S. PATENT DOCUMENTS

| | | | |
|---|---|---|---|
| 4,078,963 | 3/1978 | Symersky | 156/652 |
| 4,261,792 | 4/1981 | Tsuji et al. | 156/656 |
| 4,592,800 | 6/1986 | Landau et al. | 156/643 |
| 5,001,079 | 3/1991 | Van Laarhoven et al. | 438/50 |
| 5,350,488 | 9/1994 | Webb | 156/643 |
| 5,387,556 | 2/1995 | Xiaobing et al. | 438/228 |
| 5,582,679 | 12/1996 | Lianjun et al. | 156/651.1 |
| 5,619,072 | 4/1997 | Mehta | 257/774 |
| 5,656,543 | 8/1997 | Chung | 438/625 |
| 5,702,956 | 12/1997 | Ying et al. | 438/8 |
| 5,702,981 | 12/1997 | Maniar et al. | 438/192 |
| 5,866,945 | 2/1999 | Chen et al. | 257/750 |

OTHER PUBLICATIONS

A. J. Konecni et al., "A Stable Plasma Treated CVD Titanium Nitride Film for Barrier/Glue Layer Applications," VMIC Conference, Jun. 18–20, 1996, 1996 ISMIC—106/96/0181(c), pp. 181–183.

Kim et al., "Stability of TiN Films Prepared by Chemical Vapor Deposition Using Tetrakis–dimethylamino Titanium," Electrochem. Soc., vol. 143, No. 9, Sep. 1996, pp. L188–L190.

Iacoponi et al., "Resistivity Enhancement of CVD TiN With In–Situ Nitrogen Plasma and Its Application in Low Resistance Multilevel Interconnects," Advanced Metalization and Interconnect Systems for ULSI, 1995, (5 pages).

Eizenberg et al., "Chemical vapor deposited TiCN: A new barrier metallization for submicron via and contact applications," J. Vac. Sci. Technol. A, vol. 13, No. 3, May/Jun. 1995, pp. 590–595.

Eizenberg et al., "TiCN: A new chemical vapor deposited contact barrier metallization for submicron devices," (3 pages).

Hillman et al., "Comparison of Titanium Nitride Barrier Layers Produced by Inorganic and Organic CVD," Jun. 9–10, 1992, VMIC Conference, 1992, ISMIC—101/92/0246, pp. 246–252.

Liu et al., "Integrated HDP Technology for Sub–0.25 Micron Gap Fill," Jun. 10–12, 1997, VMIC Conference, 1997, ISMIC—107/97/0618(c), pp. 618–619.

(List continued on next page.)

*Primary Examiner*—Wael Fahmy
*Assistant Examiner*—Kurt Eaton

[57] ABSTRACT

Reliable vias are formed by providing an adequate landing area without increasing the size of the underlying feature. Embodiments include forming a lower metal feature with an ARC layer extending beyond the side surfaces of the primary conductive portion serving as an etch stop when forming the through-hole. The overhanging portion provides a suitable landing pad without increasing the size of the underlying feature. Embodiments include ARCs having a thickness ranging from about 1000 Å to about 1300 Å and an overhanging portion extending beyond the side surface of the primary conductive portion up to about 0.05 microns.

13 Claims, 5 Drawing Sheets

OTHER PUBLICATIONS

Bothra et al., "Integration of 0.25μm Three and Five Level Interconnect System for High Performance ASIC," Jun. 10–12, 1997, VMIC Conference, 1997, ISMIC—107/97/0043, pp. 43–48.

Wang et al., "Process Window Characterization of ULTIMA HDP–CVD™ USG Film," Feb. 10–11, 1997, DUMIC Conference 1997 ISMIC—222D/97/0405, pp. 405–408, 619.

Saikawa et al., "High Density Plasma CVD for 0.3 μm Device Application," Jun. 18–20, 1996, VMIC Conference 1996 ISMIC—106/96/0069(c), pp. 69–75.

Nguyen et al., "Characterization of High Density Plasma Deposited Silicon Oxide Dielectric for 0.25 Micron ULSI," Jun. 27–29, 1995, VMIC Conference 1995 ISMIC—104/95/0069, pp. 69–74.

LOWER METAL FEATURE PROFILE WITH OVERHANGING ARC LAYER TO IMPROVE ROBUSTNESS OF BORDERLESS VIAS

TECHNICAL FIELD

The present invention relates to a method of manufacturing a high density, multi-metal layer semiconductor device exhibiting a reliable interconnection pattern. The invention has particular applicability in manufacturing high density multi-metal layer semiconductor devices with design features of 0.25 microns and under.

BACKGROUND ART

The escalating requirements for high densification and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under challenges the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer, such as spin-on-glass (SOG) or high density plasma (HDP) oxide, is then applied to the resulting conductive pattern to fill in the gaps and the surface is planarized, as by conventional etching or chemical-mechanical polishing (CMP) planarization techniques.

As feature sizes, e.g., metal lines and interwiring spacings, shrink to 0.25 microns and below, such as 0.18 microns, it becomes increasingly difficult to satisfactorily fill in the interwiring spacings voidlessly and obtain adequate step coverage. It also becomes increasingly difficult to form a reliable interconnection structure. A through-hole is typically formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature.

A conventional conductive via is illustrated in FIG. 1, wherein a first or lower metal feature 10 of a first patterned metal layer is formed on first dielectric layer 11 and exposed by through-hole 12 formed in second dielectric layer 13. First metal feature 10 comprises side surfaces which taper somewhat due to etching and is typically formed as a composite structure comprising a lower layer 10A, e.g., titanium (Ti) or tungsten (W), an intermediate or primary conductive layer 10B, e.g., aluminum (Al) or an Al alloy, and an anti-reflective coating (ARC) 10C, such as titanium nitride (TiN). In accordance with conventional practices, through-hole 12 is formed so that first metal feature 10 encloses the entire bottom opening, thereby serving as a landing pad for the metal plug filling through-hole 12 to form a conductive via 16. Thus, the entire bottom surface of conductive via 16 is in direct contact with first metal feature 10. Conductive via 16 electrically connects the first metal feature 10 and a second or upper metal feature 14 which is part of a second patterned metal layer. Second metal feature 14 is also typically formed as a composite structure comprising lower layer 14A, intermediate or primary conductive layer 14B and ARC layer 14C. The plug filling the through-hole to form the conductive via is typically formed as a composite comprising a first adhesion promoting layer 15, which is typically a refractory material, such as TiN, Ti—W, or Ti—TiN, and a primary plug filling metal 17 such as W. Metal features 10 and 14 typically comprise metal lines with interwiring spacings therebetween conventionally filled with dielectric material 18, such as SOG or HDP oxide.

The reduction in design features to the range of 0.25 microns and under requires extremely high densification which mandates high aspect ratio (height/width) openings. As the aspect ratio of openings increases, it becomes increasingly more difficult to deposit a barrier layer 15 (FIG. 1) as by conventional sputtering techniques. It has been recently suggested that chemical vapor deposited (CVD) TiN can be employed to form a conformal coating in a high aspect ratio through-hole, as by the decomposition of an inorganic compound containing Ti, such as tetrakis-dimethylamino titanium (TDMAT). It has also been found that CVD TiN films exhibit a high carbon content and high resistivity. Accordingly, it has also been proposed to treat a deposited CVD TiN film in a hydrogen ($H_2$)/nitrogen ($N_2$) plasma to remove carbon and reduce the resistivity of the CVD TiN film. See, for example, A. J. Konecni et al., "A STABLE PLASMA TREATED CVD TITANIUM NITRIDE FILM FOR BARRIER/GLUE LAYER APPLICATIONS," pp. 181–183, Jun. 18–20, 1996, VMIC Conference, 1996 ISMIC; Kim et al., "Stability of TiN Films Prepared by Chemical Vapor Deposition Using Tetrakis-dimethylamino Titanium," J. Electrochem. Soc., Vol. 143, No. 9, September 1996, pp. L188–L190; J. Iacoponi et al., "RESISTIVITY ENHANCEMENT OF CVD TiN WITH IN-SITU NITROGEN PLASMA AND ITS APPLICATION IN LOW RESISTANCE MULTILEVEL INTERCONNECTS," Advanced Metallization and Interconnection Systems for ULSI Applications in 1995; Eizenberg et al., "Chemical vapor deposition TiCN: A new barrier metallization for submicron via and contact applications," J. Vac. Sci. Technol. A 13(3), May/June 1995, pp. 590–595; Eizenberg et al., "TiCN: A new chemical vapor deposited contact barrier metallization for submicron devices," Appl. Phys. Lett., Vol. 65, No. 19, Nov. 7, 1994, pp. 2416–2418; and Hillman et al., "COMPARISON OF TITANIUM NITRIDE BARRIER LAYERS PRODUCED BY INORGANIC AND ORGANIC CVD," pp. 246–252, Jun. 9–10, 1992, VMIC Conference, 1992 ISMIC.

The conventional practice of forming a landing pad completely enclosing the bottom surface of a conductive via utilizes a significant amount of precious real estate on a semiconductor chip which is antithetic to escalating high densification requirements. In addition, it is extremely difficult to voidlessly fill through-holes having such reduced dimensions because of the extremely high aspect ratio, e.g., in excess of 4. Accordingly, conventional remedial techniques comprise purposely widening the diameter of the through-hole to decrease the aspect ratio. As a result, misalignment occurs wherein the bottom surface of the conductive via is not completely enclosed by the underlying metal feature. This type of via is called a "borderless via", which also conserves chip real estate.

The use of borderless vias, however, creates new problems. For example, as a result of misalignment, the SOG gap filling layer is penetrated by etching when forming a through-hole, due to the low density and poor stability of SOG. As a result of such penetration, moisture and gas accumulate thereby increasing the resistance of the interconnection. Moreover, spiking can occur, i.e., penetration of the metal plug to the substrate causing a short.

The use of borderless vias is also problematic in that a side surface of a metal feature is exposed to etching during formation of the through-hole, resulting in the undesirable formation of an etched undercut portion of a side surface of the metal feature which is difficult to fill. Adverting to FIG. 2, first or lower metal feature 20 is formed on first insulating layer 21. First metal feature 20 is part of a first patterned metal layer comprising a first lower layer 20A, an intermediate or primary layer 20B, such as Al or an Al alloy, and an upper ARC layer 20C. A second dielectric layer 22 is formed on the first patterned metal layer and through-hole 23 etched therein. The through-hole is purposely misaligned or offset, thereby exposing a portion 24 of the upper surface of first metal feature 20 and undercutting a portion of a side surface of metal feature 20 to form an etched undercut portion 25 in the form of a concavity extending under but not including ARC 20C. The difficulty of filling a borderless via having a high aspect ratio is exacerbated by the even higher aspect ratio of the portion of the borderless via adjacent the etched undercut portion 25 on the side surface of first metal feature 20. The difficulty in depositing a barrier material on undercut concave portion 25 becomes acutely problematic.

In depositing a conventional primary plug filling material such as W from tungsten hexafluoride ($WF_6$) vapor, it is recognized that an interaction with Al occurs. Accordingly, as depicted in FIG. 1, conventional practices comprise depositing a barrier layer 15, such as TiN, by sputtering. However, it is extremely difficult to sputter TiN in a through-hole having a high aspect ratio, let alone to coat concave undercut portion on the side surface of a lower metal feature in the offset region.

Accordingly, there exists a need for a methodology enabling the formation of a borderless via while preventing the undercutting of a side surface of the lower metal feature during the formation of the borderless via.

DISCLOSURE OF THE INVENTION

An object of the present invention is a high density multilevel semiconductor device with design features of 0.25 microns and under and a reliable interconnection structure.

Another object of the present invention is a method of manufacturing a high density multilevel semiconductor device exhibiting a reliable interconnection pattern.

According to the present invention, the foregoing and other objects are achieved in part by a semiconductor device disclosed herein below. The semiconductor device includes a first dielectric layer formed on a substrate with a first patterned metal layer having gaps formed on the first dielectric layer. The first patterned metal layer has a first metal feature having a composite structure including a primary conductive portion and an upper ARC layer. The primary conductive portion includes side surfaces and an upper surface. The ARC layer extends beyond at least one of the side surfaces of the primary conductive portion, and the ARC layer has a width greater than the width of the upper surface of the primary conductive portion. The overhanging portion of the ARC layer functions as an etch stop layer to prevent undercutting of the side surfaces of the primary conductive portion when forming a through-hole. The semiconductor device further includes a second dielectric layer formed on the first patterned metal layer. The second dielectric layer has a through-hole that exposes a portion of an upper surface of the ARC layer extending beyond the side surface of the primary conductive portion. The through-hole of the semiconductor device is filled with a conductive material to form a conductive via.

Another aspect of the present invention is a method of manufacturing a semiconductor device disclosed herein below. The method of the present invention includes forming a first dielectric layer on a substrate and forming a first patterned metal layer having gaps on the first dielectric layer. The first patterned metal layer has a first metal feature having a composite structure including a primary conductive layer and an upper ARC layer. The primary conductive portion includes side surfaces and an upper surface. The ARC layer extends beyond at least one of the side surfaces of the primary conductive portion, and the ARC layer has a width greater than the width of the upper surface of the primary conductive portion. The overhanging portion of the ARC layer functions as an etch stop layer to prevent undercutting of the side surfaces of the primary conductive portion when forming a through-hole. The overhanging portion is formed by creating an undercut portion in the side surface of the primary conductive portion by controlling the amount of polymer formed during etching of the composite metal layer. A second dielectric layer is formed on the first patterned metal layer and etching is used to form a through-hole in the second dielectric layer to expose a portion of an upper surface of the ARC layer extending beyond the side surface of the primary conductive portion. The throughhole of the semiconductor device is filled with a conductive material to form a conductive via.

Additional objects, advantages and other features of the present invention will become readily apparent to those skilled in this art from the following detailed description. The detailed description depicts and describes only the preferred embodiment of the invention, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive. Further objects and advantages of the invention may also be realized and obtained as particularly pointed out in the appended claims.

DESCRIPTION OF THE DRAWINGS

Figure 1:
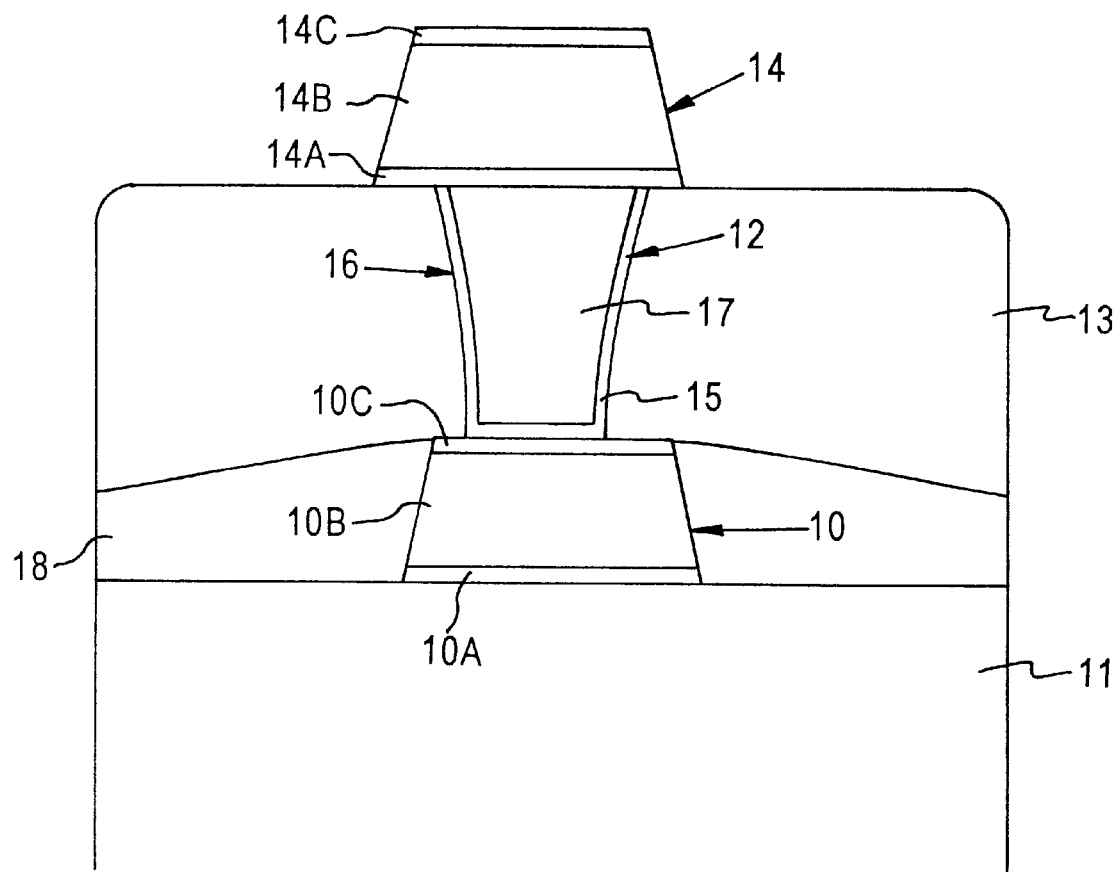
FIG. 1 schematically illustrates a conventional via structure.
Figure 2:
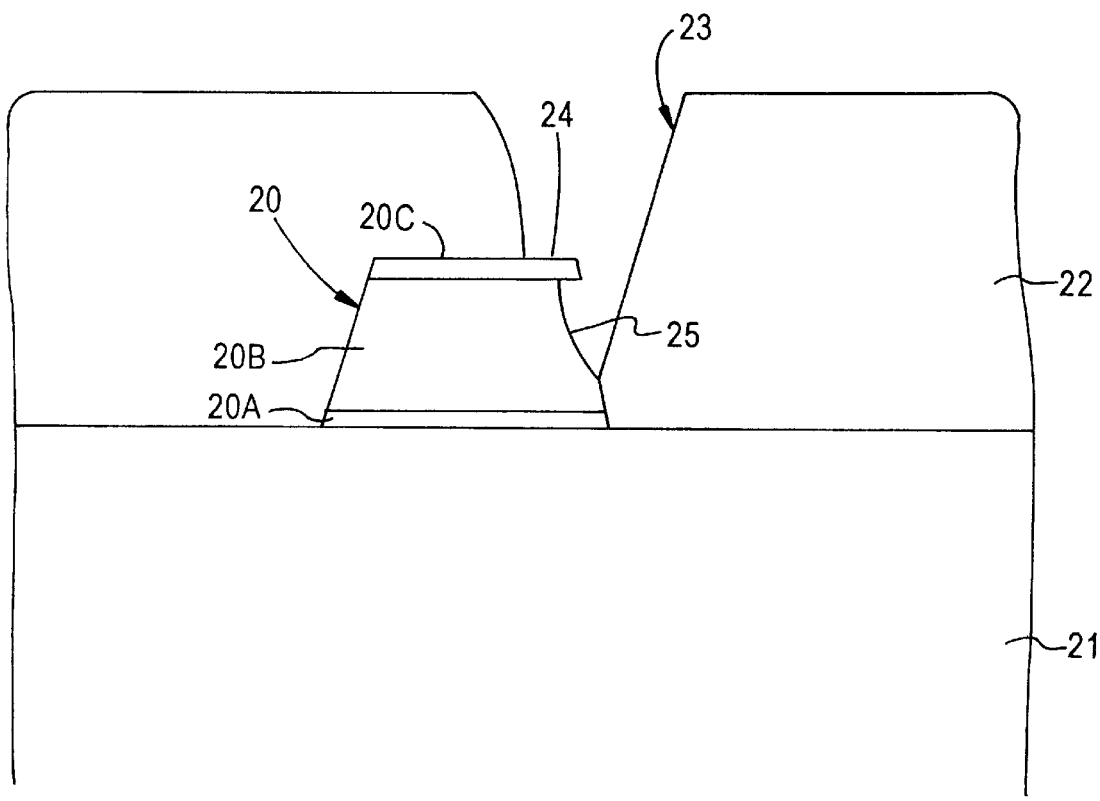
FIG. 2 schematically illustrates the undercutting problem in forming a borderless via.

The present invention addresses and solves the undercutting problem, illustrated in FIG. 2, wherein a portion of a side surface of an underlying metal feature 20 is etched during formation of through-hole 23 resulting in concave portion 25. It is virtually impossible to sputter deposit a TiN barrier layer in high aspect ratio openings, particularly the extremely high aspect ratio of an offset through-hole formed along a side surface of an underlying metal feature when forming a borderless via. If undercut portion 25 is not prevented from forming then there is the potential for reaction with $WF_6$ during plug filling. Moreover, if the undercut portion 25 is not prevented from forming then the potential exists that the resulting interconnection would contain a void and etching residues which would increase the resistance of the interconnection and adversely affect device performance.

The present invention provides methodology enabling the formation of a reliable conductive via without sacrificing feature size while preventing the undercutting of a side surface of the lower metal feature. In accordance with embodiments of the present invention, a composite metal layer is etched to form a conductive pattern. However, metal features for electrical connection to overlying metal features by means of a conductive via are etched under controlled conditions to provide the ARC layer with an overhanging portion. During etching to form a through-hole, the overhanging ARC layer acts as an etch stop layer to prevent an otherwise misaligned through-hole from undercutting a portion of a side surface of the primary conductive layer. The present invention allows for the formation of a misaligned through-hole for a via which is "borderless" in the sense that the via does not land within the border of the primary conductive portion of the lower metal feature, but advantageously avoids contact with a side surface of the lower primary conductive portion.

The present invention uses a subtractive etching or etch back step as the primary metal patterning technique. Such a method involves the formation of a first dielectric layer on a semiconductor substrate, typically doped monocrystalline silicon, with conductive contacts formed therein for electrical connection with an active region on the semiconductor substrate, such as a source/drain region. A metal layer is deposited on the first dielectric layer which is typically formed as a composite structure comprising a lower layer, e.g., Ti or W, an intermediate or primary conductive layer, e.g., Al or an Al alloy, such as an Al-copper alloy, and an ARC, such as TiN. A photoresist mask is then formed on the metal layer having a pattern corresponding to a desired conductive pattern. The metal layer is etched through the photoresist mask to form the conductive pattern comprising submicron features below about 0.25 microns, e.g., below about 0.18 microns, separated by gaps, such as a plurality of metal lines with interwiring spacings therebetween.

Conventional metal features are typically formed with side surfaces which taper slightly outward due to the etching process. The slope of the side surfaces of the metal feature is determined by the amount of polymer formed during etching. In accordance with embodiments of the present invention, the amount of polymer formed during etching is controlled, i.e., reduced to the extent that the side surfaces of the primary conductive layer are purposely undercut to form recessed side surfaces extending under the ARC layer. Thus, embodiments of the present invention limit the amount of polymer formed during etching of the composite metal layer to form a metal feature having an ARC layer with a portion overhanging or extending beyond the side surfaces of the underlying primary conductive portion.

In order to achieve an overhanging portion sufficient to satisfy the objectives of the present invention, the amount of polymer formed during etching is reduced below that in conventional etching regimes, wherein the side surfaces of the metal features taper slightly outward. For example, it is known that high chlorine ($Cl_2$) concentrations in the etching recipe lead to high chemical-etch rates, which in turn lead to undercut Al profiles. A conventional etching recipe includes gas additives such as nitrogen, $CHF_3$, $CF_4$, $FS_6$, $CH_3$, and HCl. The precise amounts of gas additives used depend upon the percentage of copper or other metal alloy in the primary conductive Al alloy layer. A reduction in polymer formation along the side surfaces of the metal feature during etching of the metal layer can be accomplished by varying the amount of $Cl_2$ or additives or other polymer effecting process variable. For example, decreasing nitrogen concentrations, will reduce the amount of polymer formed to the extent of forming an overhanging ARC portion. Similar results can be achieved by decreasing the $CHF_3$ concentration, or increasing the $Cl_2$ concentration. The amount of polymer formed can also be limited by increasing the conventional etching to a relatively high temperature.

In accordance with the present invention, a gap filling dielectric layer, such as SOG, hydrogen silsesquioxane (HSQ) or HDP oxide, can be applied to fill in the gaps. A second dielectric layer is then applied. A through-hole having an internal surface is formed in the second dielectric layer. The through-hole is intended for an otherwise borderless via. Accordingly, the through-hole is intentionally misaligned to expose a portion of the ARC layer overhanging the side surfaces of the underlying primary metal portion. Since the ARC layer comprises an etch resistant material, it acts as an etch stop layer preventing exposure of the side surfaces of the primary metal portion. A barrier layer is then deposited on the internal surface of the through-hole and the exposed portion of the upper surface of the ARC layer by conventional sputtering techniques, or other techniques, such as CVD to form a conformal coating in high aspect ratio through-holes.

After depositing a barrier layer, the through-hole is filled with a conductive material, such as W, employing conventional methodology to form a composite plug in the borderless via. A second metal layer is then deposited on the second dielectric layer and patterned to form an upper second metal feature electrically connected to the underlying first metal feature through the borderless via formed in accordance with the present invention.

Figure 3:
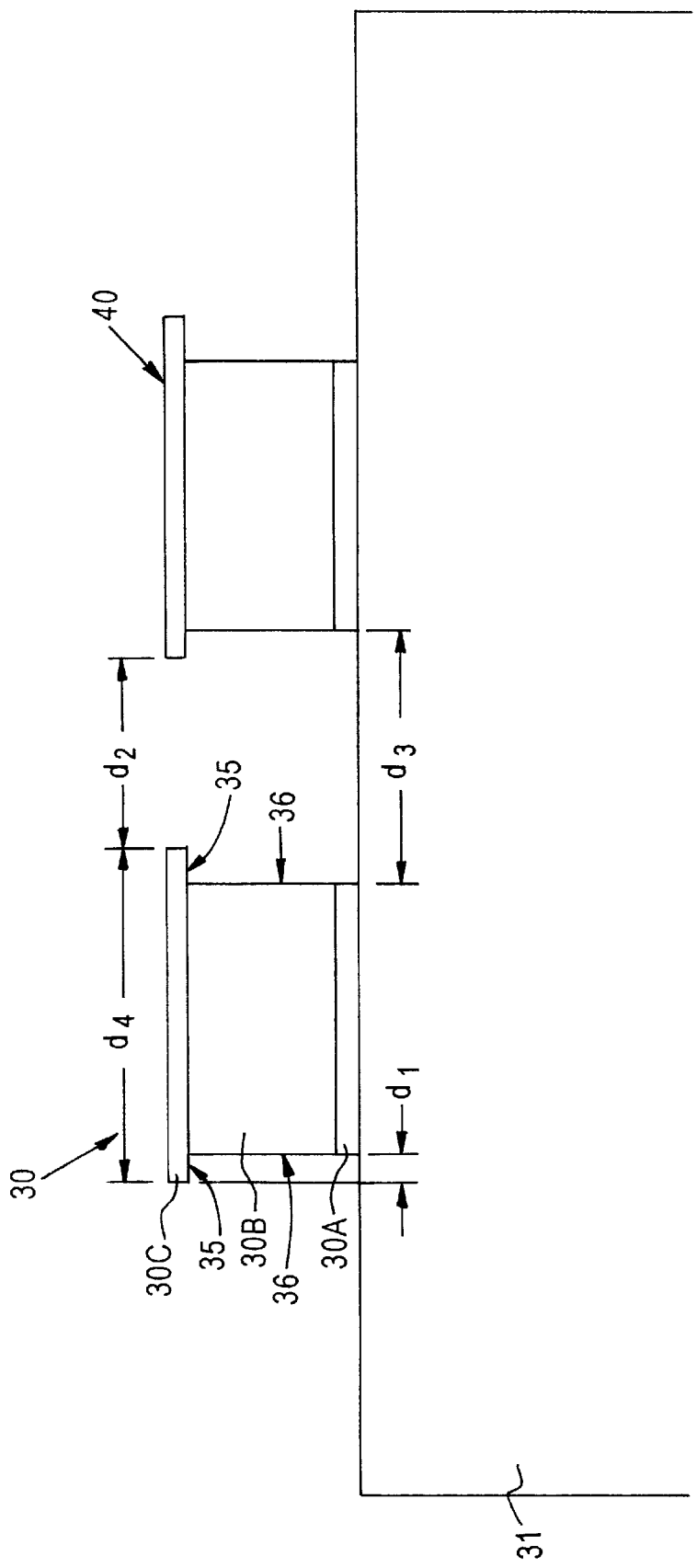
FIG. 3 schematically illustrates a first metal feature having an overhanging ARC layer formed in accordance with an embodiment of the present invention.

An embodiment of the present invention is schematically illustrated in FIG. 3 and comprises a first or lower metal feature 30 formed on first dielectric layer 31 which in turn is formed on a substrate (not shown), such as an appropriately doped monocrystalline silicon semiconductor substrate. First metal feature 30, such as a conductive line, comprises a lower layer 30A, such as W or Ti, an intermediate or primary conductive layer 30B, such as Al or an Al alloy, and ARC layer 30C, such as TiN, or Ti-TiN. The metal feature 30 has an ARC layer 30C with a portion 35 overhanging or extending beyond opposing side surfaces 36 of primary conductive layer 30B. Lower layer 30A may or may not be etched to the same extent as the primary conductive layer 30B, thereby forming a metal profile having either a "T" shape (depicted in FIGS. 3–5) or and "I" shape (not shown), respectively.

The ARC layer 30C of the present invention is formed at a suitable thickness, such as a thickness of about 1000 Å to about 1300 Å, e.g., about 1150 Å, to enable the ARC layer 30C to function as an etch resistant stop layer. The first metal feature 30 and any adjacent metal feature 40 are dimensioned to avoid any unwanted electrical interaction therebetween. The overhanging portion 35 of the upper ARC layer extends beyond the side surfaces 36 of the primary conductive layer by a distance $d_1$, e.g., up to about 0.05 microns. The interwiring spacings between metal feature 30 and adjacent metal feature 40, which is in effect the distance $d_3$ between the primary conductive layers of those metal features, is typically about 0.375 microns for features of about 0.25 microns. The distance $d_2$ between the ARC layers of adjacent metal features 30 and 40 is, therefore, about 0.275 microns or more. The width $d_4$ of the ARC layer 30C is preferably about 0.5 microns.

Figure 4:
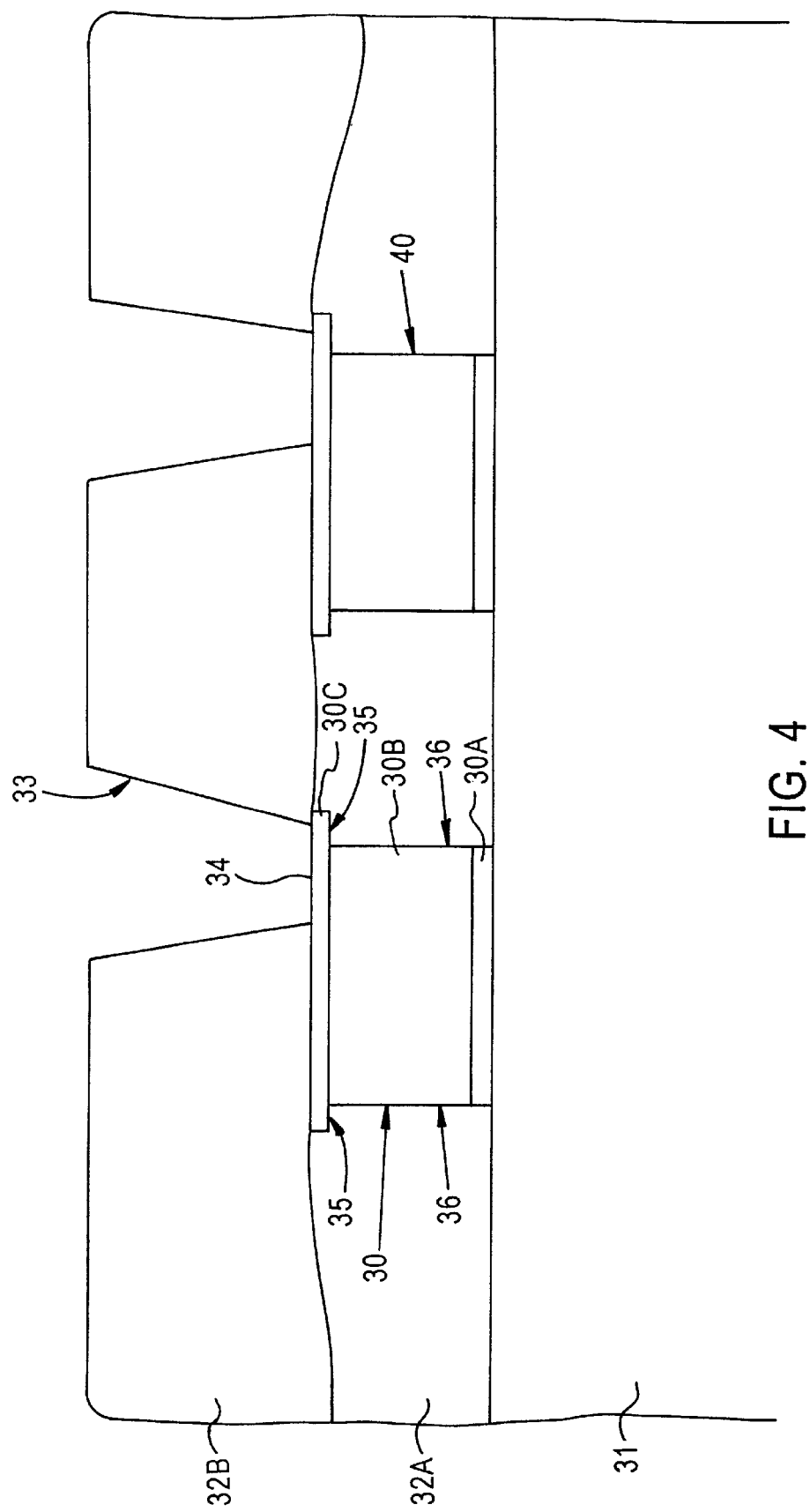
FIG. 4 schematically illustrates a borderless via through-hole formed in accordance with an embodiment of present invention.

As depicted in FIG. 4, the gaps or interwiring spacings on both sides of first metal feature 30 are filled by dielectric material 32A, such as SOG, HSQ or an HDP oxide. A second dielectric layer 32B is formed on first pattern metal layer and a misaligned through-hole 33 is formed in second dielectric layer 32B to expose a portion 34 of ARC layer 30C overhanging a side surface 36 of the underlying primary metal layer.

Figure 5:
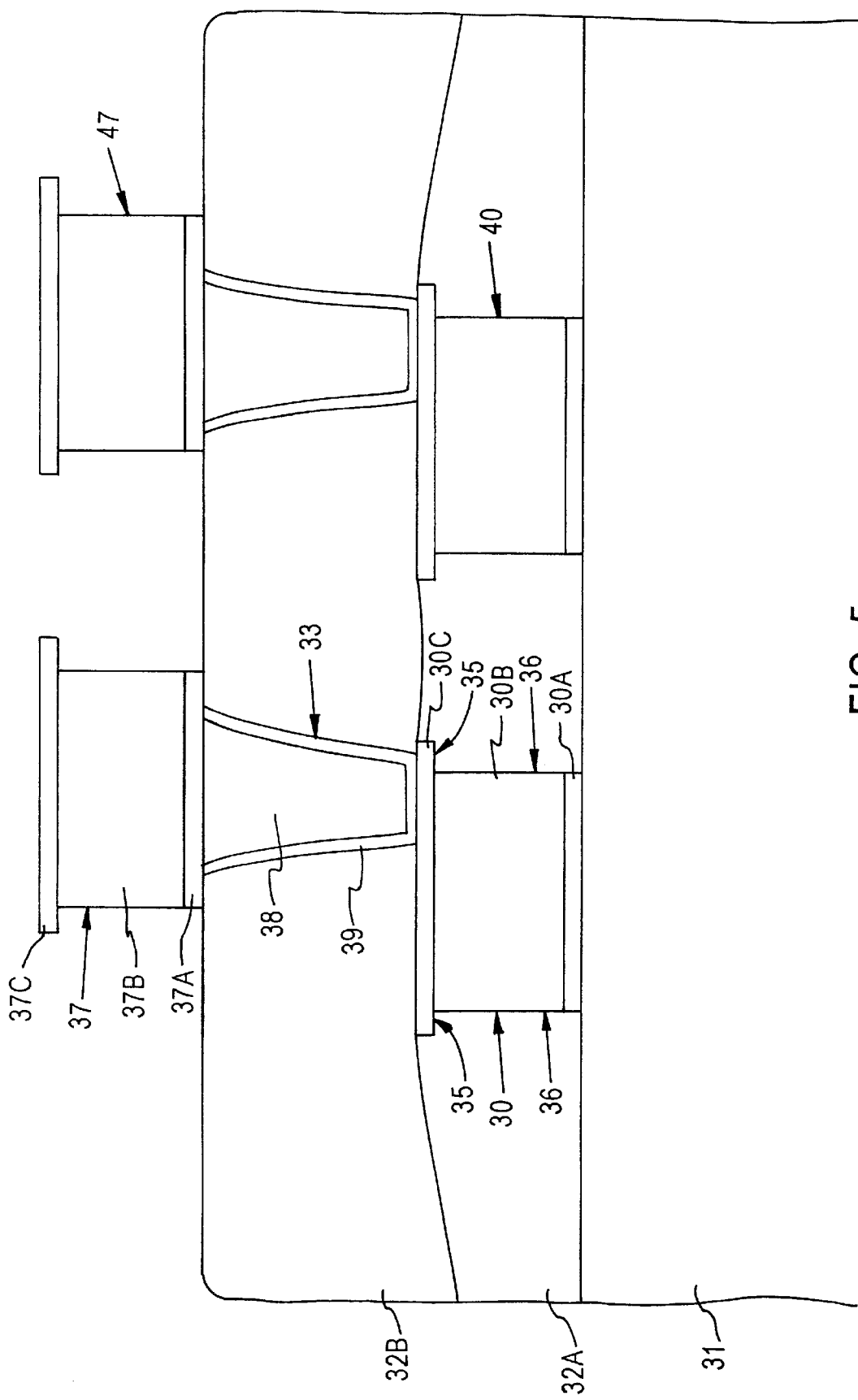
FIG. 5 schematically illustrates a borderless via formed in accordance with an embodiment of present invention.

In accordance with the present invention, a barrier layer 39 is formed, as depicted in FIG. 5, by conventional techniques and plasma treated, if necessary, to reduce its carbon content and resistivity. The through-hole 33 is then filled with a suitable plug metal 38, such as W. A second metal layer is then deposited on second dielectric layer 32B and patterned to form a second or upper metal feature 37 comprising lower layer 37A, e.g., Ti or W, intermediate or primary conductive layer 37B, e.g., Al or an Al alloy, and upper ARC layer 37C, such as TiN, or Ti—TiN. The second metal feature 37 is thereby electrically connected to first metal feature 30 by the otherwise borderless via comprising barrier layer 39 and W plug 38. Adjacent metal feature 40 is similarly electrically connected to a second metal feature 47 by a conductive via.

The present invention is applicable to the production of various types of semiconductor devices, particularly high density, multi-metal layer semiconductor devices, with submicron features of 0.25 microns and below, exhibiting high speed characteristics and improved interconnection reliability. The present invention is cost effective and can easily be integrated into conventional processing.

In carrying out the embodiments of the present invention, the metal layers, particularly the primary conductive layer, can be formed of any metal typically employed in manufacturing semiconductor devices, such as Al, Al alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and plasma enhanced chemical vapor deposition (PECVD). Normally, when high melting metal point metals such as tungsten are deposited, CVD techniques are employed. Low melting point metals, such as Al and Al alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, the method comprising the steps of:
    forming a first dielectric layer on a substrate;
    forming a first patterned metal layer having gaps on the first dielectric layer, wherein the first patterned metal layer comprises a first metal feature having a composite structure comprising:
        a primary conductive portion with side surfaces and an upper surface having a first width; and
        an upper anti-reflective coating extending beyond at least one side surface of the primary conductive portion and having a second width greater than the first width;
    forming a second dielectric layer on the first patterned metal layer;
    etching the second dielectric layer to form a misaligned through-hole having an internal surface and exposing only a portion of an upper surface of the anti-reflective coating including a portion extending beyond a side surface of the primary conductive portion; and
    filling the misaligned through-hole with conductive material to form a conductive via.

2. The method according to claim 1, wherein the anti-reflective coating extends beyond both side surfaces of the primary conductive portion.

3. The method according to claim 1, comprising:
    depositing the primary conductive portion;
    depositing the anti-reflective coating;
    etching under controlled conditions to form the first patterned metal layer comprising the first metal feature having an undercut portion in a side surface of the primary conductive portion.

4. The method according to claim 3, comprising depositing a lower layer of Ti or W before depositing the primary conductive portion.

5. The method according to claim 3, comprising limiting the amount of polymer formed during etching to form the undercut portion.

6. The method according to claim 5, comprising etching with an etch recipe including one or more gas additives selected from the group consisting of nitrogen, $CHF_3$, $CF_4$, $FS_6$, $CH_3$, and HCl, and undercutting the side surfaces of the primary conductive portion by limiting/reducing an amount of polymer formed by decreasing the amount of nitrogen, decreasing the amount of $CHF_3$, and/or increasing the amount of chlorine in the etch recipe.

7. The method according to claim 5, comprising limiting the amount of polymer formed by increasing the etching temperature.

8. The method according to claim 1, wherein the anti-reflective coating extends beyond a side surface of the primary conductive portion up to about 0.05 microns.

9. The method according to claim 1, wherein the anti-reflective coating has a thickness of about 1000 Å to about 1300 Å.

10. The method according to claim 9, wherein the antireflective coating has a thickness of 1150 Å.

11. The method according to claim 1, wherein the antireflective coating comprises TiN, or Ti—TiN.

12. The method according to claim 1, wherein the primary conductive portion contains aluminum or an aluminum alloy.

13. The method according to claim 1, further comprising the step of forming a second patterned metal layer on the second dielectric layer, wherein the second patterned metal layer comprises a second metal feature electrically connected to the first metal feature through the conductive via.

* * * * *